United States Patent [19]

Olsson

[11] 4,178,630

[45] Dec. 11, 1979

[54] FLUID-COOLED THYRISTOR VALVE

[75] Inventor: Karl E. Olsson, Ludvika, Sweden

[73] Assignee: ASEA Aktiebolag, Västerås, Sweden

[21] Appl. No.: 920,871

[22] Filed: Jun. 30, 1978

[30] Foreign Application Priority Data

Jul. 12, 1977 [SE] Sweden .................................. 7708073

[51] Int. Cl.² ............................................ H02M 7/00
[52] U.S. Cl. ....................................... 363/141; 357/82
[58] Field of Search ...................... 357/81, 82; 363/14, 363/141

[56] References Cited

U.S. PATENT DOCUMENTS

| | | | |
|---|---|---|---|
| 3,389,305 | 6/1968 | Bond | 357/82 X |
| 3,502,956 | 3/1970 | Fries et al. | 363/141 |
| 3,668,506 | 6/1972 | Beasley et al. | 357/82 X |
| 3,703,668 | 11/1972 | Bylund et al. | 357/82 |
| 3,921,201 | 11/1975 | Eisele et al. | 357/82 |
| 3,943,426 | 3/1976 | Thiele et al. | 357/81 X |

*Primary Examiner*—William M. Shoop
*Attorney, Agent, or Firm*—Pollack, Vande Sande & Priddy

[57] ABSTRACT

A fluid-cooled thyristor valve including a plurality of series-connected thyristors that are cooled by non-conducting fluid flowing through electrically conducting cooling bodies positioned at the anode and cathode sides of the thyristors. The cooling bodies at opposite sides of adjacent thyristors are connected by fluid pipes that pass the cooling fluid. A plurality of electrically conducting sections of pipe connect the cooling body on the anode side and the cooling body on the cathode side of adjacent thyristors to pass the cooling fluid in one direction and to electrically connect the thyristors in series through the electrically conducting cooling bodies. A plurality of electrically insulated sections of pipe connects the cooling body on the cathode side and the cooling body on the anode side of adjacent thyristors to pass the cooling fluid in the opposite direction. A cooling body of each thyristor is attached in an insulated relation to a support beam and each thyristor and its associated unattached cooling body is detachably clamped to the associated attached cooling body. The electrically conducting pipe may be positioned to cross the insulated pipe between adjacent thyristors to uniformly place the thyristors.

10 Claims, 3 Drawing Figures

FLUID-COOLED THYRISTOR VALVE

BACKGROUND OF THE INVENTION

The invention relates to a fluid-cooled thyristor valve and, more particularly, to such a valve including means to electrically connect the thyristors of the valve in series and to pass a cooling fluid in opposite directions between cooling bodies to uniformly cool the thyristors.

Thyristor valves that include several series-connected thyristors are typically used in high voltage applications, for example high voltage static convertors.

The design of such high voltage valves must necessarily provide for operational electrical factors such as voltage distribution, insulation and glow protection and mechanical factors such as strength of construction, compactness, ease of manufacture and repair, and a safe and uniform cooling of the thyristors of the valve.

Disc-shaped thyristors are now commonly used for high voltage and high power applications and such thyristors are suitable for use with apparatus for cooling the two sides of the thyristor.

Accordingly, it is an object of the invention to provide a thyristor valve including means to uniformly cool the component thyristors of the valve and to connect the thyristors in series.

A further object of the invention is to provide such a thyristor valve wherein individual thyristors may be removed from the valve and repaired or replaced without dismantling the entire valve.

Another object of the invention is to provide such a uniformly cooled thyristor valve that is strong and relatively compact.

A further object of the invention is to provide a high voltage thyristor valve construction that includes a number of thyristor modules that may be supported in a compact stacked relation.

These and other objects of this invention will become apparent from a review of the detailed specification which follows and a consideration of the accompanying drawings.

BRIEF SUMMARY OF THE INVENTION

In order to achieve the objects of the invention and to overcome the problems of the prior art, the fluid-cooled thyristor valve, according to the invention, includes means to electrically connect the thyristors of the valve in series and to pass a cooling fluid in opposite directions between cooling bodies associated with the anode and cathode series of the thyristors to uniformly cool the thyristors.

More particularly, an embodiment of the invention includes a plurality of thyristors that are connected in series to form the thyristor valve, with an anode connection for the valve at one end of the series chain of thyristors and a cathode connection for the valve at the other end.

An electrically conducting cooling body is positioned on either side of each of the thyristors of the valve in order to uniformly cool the thyristors.

A plurality of electrically conducting sections of pipe connect the cooling body on the anode side and the cooling body on the cathode side of adjacent thyristors to pass the cooling fluid in one direction and to electrically connect the thyristors in series through the electrically conducting cooling bodies. Likewise, a plurality of electrically insulated sections of pipe connects the cooling body on the anode side and the cooling body on the cathode side of adjacent thyristors to pass the cooling fluid in the other direction.

A cooling body of each of the thyristors is attached in an insulated relation to a continuous support beam and each thyristor and its associated opposite unattached cooling body is detachably clamped to the associated attached cooling body to independently secure each thyristor and its associated cooling bodies to the beam.

Magnetic cores are attached to the electrically conducting pipe to provide reactance in the series thyristor circuit. In addition, a voltage divider circuit may be connected in parallel with the thyristors by connecting appropriate points in the circuit to corresponding points on the conducting pipes or cooling bodies.

Furthermore, a glow protection shield may be positioned to surround the thyristor valve and connected to a point on the center conducting pipe. In addition, the conducting and insulated fluid pipes may be arranged to cross between adjacent thyristors to provide more uniform cooling.

An embodiment of the invention is provided wherein separate thyristor valve modules are mounted in a stacked relation in a rack and cross connected to provide a single large thyristor valve.

A further simplified embodiment is provided wherein the thyristors of a valve are positioned in alternating conducting directions and the fluid pipes are arranged to conduct fluid in straight lines.

DETAILED DESCRIPTION OF PREFERRED EMBODIMENTS

Figure 1:
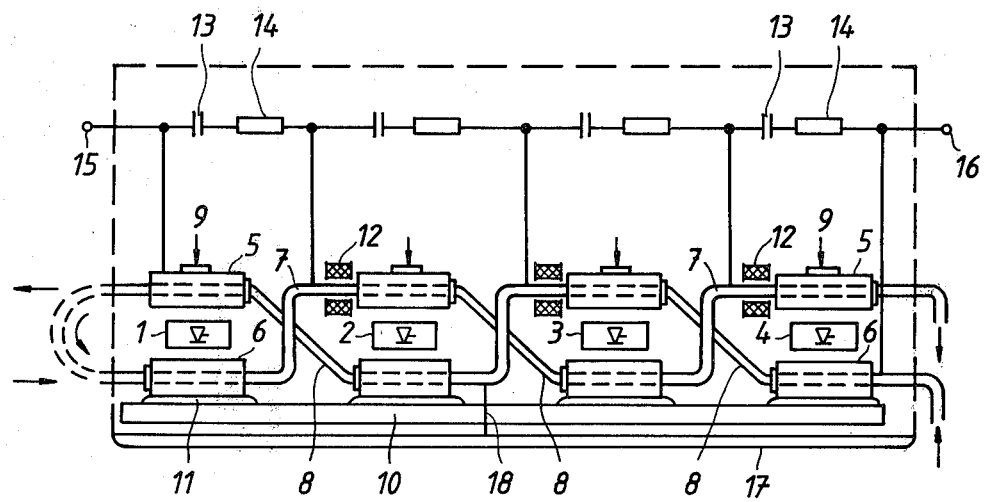
FIG. 1 shows a diagram of a fluid-cooled thyristor valve according to the invention.

The remaining portion of this specification will describe preferred embodiments of the invention when read in conjunction with the attached drawings, in which like reference characters identify identical apparatus.

FIG. 1 illustrates a number of thyristors 1-4 that are connected in series to form a thyristor valve. The individual thyristors in the valve may typically be disc-shaped, although the invention is not limited to operation with disc-shaped thyristors since other thyristor shapes that lend themselves to double-sided cooling may also be employed without departing from the spirit of the invention.

In accordance with the invention, a cooling body is placed at a cathode side and an anode side of each of the thyristors 1-4 to cool the thyristors. For example, as illustrated in FIG. 1, a cooling body 6 is associated with the cathode side of each of the thyristors 1-4 and a cooling body 5 is associated with the anode side of the thyristors.

A non-conducting cooling fluid, for example distilled water, is pumped through the cooling bodies 5 and 6 of the thyristors by means of pipes 7 and 8 in order to carry away heat that is generated by the operation of the thyristors. The pipes 7 of the cooling system are also used to electrically connect the thyristors 1-4 in a series circuit to form a thyristor valve and the pipes 8 are constructed of non-conducting material or are otherwise insulated to prevent the flow of electrical current.

The electrical connection between successive thyristors is made through the cooling pipe 7 and associated cathode and anode cooling bodies of the thyristors. For example, an anode valve point 15 is connected to the anode cooling body 5 of the thysirtor 1 and the anode cooling body 5 is connected to the anode of the thyristor 1. The cathode of the thyristor 1 is connected to its cathode cooling body 6 and the cathode cooling body 6 of the thyristor 1 is electrically connected to the anode cooling body 5 of the next successive thyristor 2 by an intermediate conducting section of pipe 7. Likewise, the successive thyristors 2-4 are connected in series through the conducting pipe 7 and the associated conducting cooling bodies to the cathode valve point 16 to form the series thyristor circuit of the thyristor valve of FIG. 1.

Is should be appreciated that the thyristors 1-4 are cooled by two parallel counter-directed streams of fluid which cross one another and each comprises electrically conducting and non-conducting tubes 7 and 8, respectively. In addition, as shown by the broken lines of FIG. 1, the outside ends of the anode and cathode cooling bodies 5 and 6 of the thyristor 1 may be interconnected by an electrically insulated pipe to circulate the cooling fluid.

As shown in FIG. 1, the cathode cooling bodies 6 are supported by a continuous beam 10. If the beam 10 is constructed of conducting material, it should be appreciated that the electrically conducting cathode cooling bodies must be supported in an insulated relation to the beam, for example by insulating spacers 11. Alternatively, the beam 10 could be constructed of non-conducting material to avoid shorting the conducting cooling bodies 6 to one another.

Each thyristor and its associated anode cooling body 5 is clamped to its cathode cooling body 6 and to the beam 10 by means of a holder that is indicated symbolically in FIG. 1 by an arrow 9. Is should be appreciated that such holders are well-known to the art and, therefore, the invention is not limited to the use of a particular holder. In addition, it should be understood that since each thyristor is clamped by its own holder, it will necessarily be easy to replace a particular damaged thyristor without having it dismantle the rest of the thyristor valve.

High voltage thyristor valves often require the connection of reactors between the thyristors of the valve in order to regulate the derivative of the current in the valve and in the individual thyristors when the thyristors are ignited and turned off. In accordance with the invention, such reactors are provided by fitting iron cores 12, for example whole or divided ring-cores, to the electrically conducting pipe 7.

In order to ensure that there is a correct voltage distribution across the thyristors of the valve and to operate ignition devices (not shown) for the thyristors, the thyristor valve may be connected in parallel with a resistance-capacitance voltage divider, for example the series-connected capacitors 13 and resistors 14 of FIG. 1. As shown in FIG. 1, various voltage tap off points of such a voltage divider are connected to particular connection points on the conducting cooling pipe 7. Alternatively, the tap off points of the divider could be connected to the conducting cooling bodies.

It should be appreciated that the beam 10 may be formed to provide a mounting surface for the capacitors 13 and resistors 14 of the voltage divider and the ignition devices of the thyristors 1-4. Thus, the circulation of cooling fluid in the cooling pipes 7 and 8 may be used to cool the ignition devices of the thyristors as well as the components of the voltage divider. Of course, the anode and cathode points of connection 15 and 16 of the thyristor valve may be connected, as shown, to the voltage divider.

A high voltage thyristor valve in accordance with the invention may be provided with a glow protection device that includes a conducting screen 17 that is connected to a point on the valve, for example the center 18 of the valve. As indicated by the broken line in FIG. 1, such a glow protection screen surrounds all of the components of the valve of FIG. 1.

Figure 2:
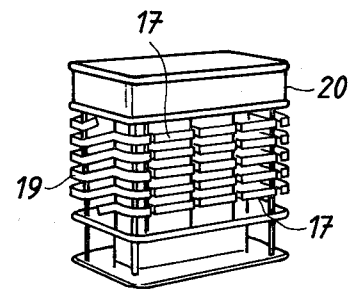
FIG. 2 illustrates a perspective view of a modular thyristor valve according to the invention.

FIG. 2 illustrates a large thyristor valve in accordance with the invention. The large valve is made up of many interconnected thyristor modules that may each be constructed in the manner shown in FIG. 1. The large thyristor valve of FIG. 2 includes a rack that is adapted to receive the thyristor modules at various levels and to support the modules in a stacked relation. The rack of FIG. 2 is open to allow the insertion of thyristor modules from either side.

As shown in FIG. 2, one side of each level of the rack contains three thyristor modules that are each surrounded by their respective glow protection screens 17. In accordance with the invention, cooling pipes and signaling circuits for the large thyristor valve are positioned in the center of the rack and the different levels of the rack are interconnected by connections 19. The connections 19 can be used as glow protection screens in conjunction with the individual module screens 17 and the combined connections 19 and screens 17 also help distribute voltage across the large valve.

It should be appreciated that auxiliary devices can be placed in a box 20 at the top of the large thyristor valve and, in addition, several large valves can be positioned on top of one another to form one phase of a convertor bridge.

Figure 3:
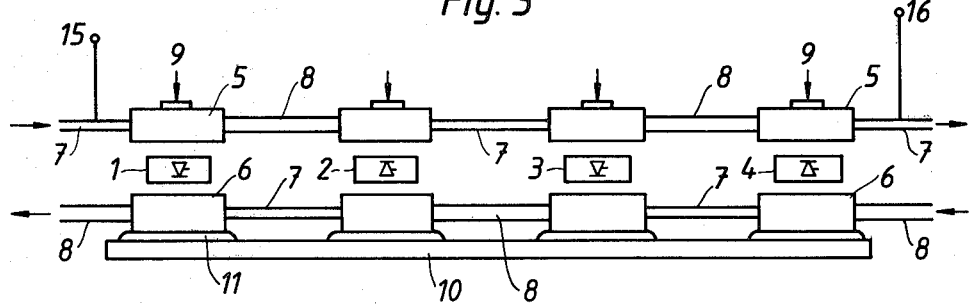
FIG. 3 shows a diagram of a simplified fluid-cooled thyristor valve according to the invention.

FIG. 3 shows a simplified embodiment of the invention in which the cooling pipes 7 and 8 are not crossed but are run straight from one cooling body to another. However, in this case successive thyristors must be aligned in opposite conducting directions so that the conducting pipes 7 and the associated cooling bodies 5 and 6 may electrically connect the thyristors 1-4 in series. It should be understood that the cooling pipes 8 of the embodiment of FIG. 3 are insulated and, therefore, do not conduct electricity. In addition, it should be understood that a voltage divider and a glow protection screen could be included in the apparatus of FIG. 3 in the same manner as is shown for the apparatus of FIG. 1.

The invention may be embodied in other specific forms without departing from its spirit or essential characteristics. The present embodiments are, therefore, to be considered in all respects as illustrative and not restrictive, the scope of the invention being indicated by the claims rather than by the foregoing description, and all changes which come within the meaning and range of the equivalents of the claims are therefore intended to be embraced therein.

What is claimed is:

1. A fluid-cooled thyristor valve comprising:
   an anode and a cathode connection;
   a plurality of thyristors electrically connected in series;

a plurality of electrically conducting cooling bodies positioned at the anode and cathode sides of said thyristors to pass a cooling fluid to cool said thyristors;

a plurality of electrically conducting fluid pipes cooperating with said electrically conducting cooling bodies to electrically connect the thyristors in series by connecting the cooling body on the anode side of each thyristor with the cooling body on the cathode side of an adjacent thyristor;

a plurality of electrically insulated fluid pipes for connecting the cooling body on the anode side of each thyristor with the cooling body on the cathode side of another adjacent thyristor.

2. The thyristor valve of claim 1 wherein said thyristors are disc-shaped.

3. The thyristor valve of claim 1 including magnetic cores operatively associated with said electrically conducting fluid pipes to provide electrical reactance in the series thyristor circuit.

4. The thyristor valve of claim 1 including a voltage divider circuit and means for connecting said circuit in parallel to said thyristors at points on said electrically conducting fluid pipes and said electrically conducting cooling bodies.

5. The thyristor valve of claim 4 wherein said voltage divider circuit includes resistive and capacitive components.

6. The thyristor valve of claim 5 including means for attaching a cooling body of each of said thyristors in an insulated relation to a support beam, holding means for detachably clamping each of the attached cooling bodies to its associated thyristor and opposite associated cooling body, and means for supporting said resistive and capacitive components of said voltage divider on said beam.

7. The thyristor valve of claim 1 including means for attaching a cooling body of each of said thyristors in an insulated relation to a support beam, and holding means for detachably clamping each of the attached cooling bodies to its associated thyristor and opposite associated cooling body.

8. The thyristor valve of claim 7 including means for providing glow protection for the valve.

9. The thyristor valve of claim 1 wherein said electrically conducting fluid pipe is arranged to cross said insulated fluid pipe between adjacent thyristors.

10. The thyristor valve of claim 1 including means for supporting said thyristor valve in a stacked relation to other thyristor valves to form a larger thyristor valve.

* * * * *